United States Patent
Russ et al.

(10) Patent No.: US 10,797,215 B2
(45) Date of Patent: Oct. 6, 2020

(54) GRADED THERMOELECTRIC MATERIALS

(71) Applicants: Boris Russ, Berkeley, CA (US); David Brown, Washington, DC (US); Jared Lynch, Fremont, CA (US); Tristan Day, Whittier, CA (US); Nelson E. Coates, Oakland, CA (US); Ayaskanta Sahu, Berkeley, CA (US); Jason D. Forster, Berkeley, CA (US); Jeffrey Snyder, Pasadena, CA (US); Jeffrey J. Urban, Emeryville, CA (US); Rachel A. Segalman, Santa Barbara, CA (US)

(72) Inventors: Boris Russ, Berkeley, CA (US); David Brown, Washington, DC (US); Jared Lynch, Fremont, CA (US); Tristan Day, Whittier, CA (US); Nelson E. Coates, Oakland, CA (US); Ayaskanta Sahu, Berkeley, CA (US); Jason D. Forster, Berkeley, CA (US); Jeffrey Snyder, Pasadena, CA (US); Jeffrey J. Urban, Emeryville, CA (US); Rachel A. Segalman, Santa Barbara, CA (US)

( * ) Notice: Subject to any disclaimer, the term of this patent is extended or adjusted under 35 U.S.C. 154(b) by 947 days.

(21) Appl. No.: 15/254,918

(22) Filed: Sep. 1, 2016

(65) Prior Publication Data
US 2017/0069815 A1 Mar. 9, 2017

Related U.S. Application Data

(60) Provisional application No. 62/215,352, filed on Sep. 8, 2015, provisional application No. 62/247,310, filed
(Continued)

(51) Int. Cl.
*H01L 35/26* (2006.01)
*H01L 35/16* (2006.01)
*H01L 35/34* (2006.01)

(52) U.S. Cl.
CPC ............... *H01L 35/26* (2013.01); *H01L 35/16* (2013.01); *H01L 35/34* (2013.01)

(58) Field of Classification Search
CPC ......... H01L 35/16; H01L 35/34; H01L 35/26; H01L 29/0665; H01L 29/0669;
(Continued)

(56) References Cited

U.S. PATENT DOCUMENTS 6,759,587 B2 7/2004 Toshima et al.
7,267,875 B2 9/2007 Whiteford et al.
(Continued)

FOREIGN PATENT DOCUMENTS

WO WO-2012158847 A2 * 11/2012 ......... H01L 29/0665

OTHER PUBLICATIONS

Lynch, J., et al. Ligand Coupling Symmetry Correlates with Thermopower Enhancement in Small-Molecule/Nanocrystal Hybrid Materials. ACS Nano 8, 10528-10536 (2014).
(Continued)

*Primary Examiner* — Matthew E. Hoban
*Assistant Examiner* — Lynne Edmondson

(57) ABSTRACT

This disclosure provides systems, methods, and apparatus related to graded thermoelectric materials. In one aspect, a method includes providing a plurality of nanostructures. The plurality of nanostructures comprise a thermoelectric material, with nanostructures of the plurality of nanostructures having first ligands disposed on surfaces of the nanostructures. The plurality of nanostructures is deposited on a substrate to form a layer. The layer is contacted with a solution containing second ligands. A ligand exchange process occurs where some of the first ligands disposed on the plurality of nanostructures are replaced with the second ligands. A first region of the layer is removed from contact with the solution so that the ligand exchange process does
(Continued)

not occur in the first region of the layer, with the ligand exchange process occurring in the layer in contact with the solution. The layer is then removed from contact with the solution.

20 Claims, 6 Drawing Sheets

Related U.S. Application Data on Oct. 28, 2015, provisional application No. 62/256,786, filed on Nov. 18, 2015, provisional application No. 62/333,409, filed on May 9, 2016, provisional application No. 62/348,590, filed on Jun. 10, 2016.

(58) Field of Classification Search
CPC ..... H01L 29/12; H01L 29/2203; H01L 29/36; H01L 21/02601; B82Y 40/00
USPC ...................................................... 252/62.3 T
See application file for complete search history.

(56) References Cited

U.S. PATENT DOCUMENTS

| | | | |
|---|---|---|---|
| 7,585,564 | B2 | 9/2009 | Whiteford et al. |
| 8,067,259 | B2 | 11/2011 | Laundry et al. |
| 8,492,643 | B2 | 7/2013 | Lee et al. |
| 8,563,133 | B2 | 10/2013 | Whiteford et al. |
| 8,604,331 | B2 | 12/2013 | Rhyee et al. |
| 9,065,014 | B2 | 6/2015 | Kim et al. |
| 9,130,066 | B2 | 9/2015 | Hwang et al. |
| 9,149,836 | B2 | 10/2015 | Whiteford et al. |
| 9,882,108 | B2* | 1/2018 | Urban ............... H01L 35/16 |
| 2009/0211629 | A1* | 8/2009 | Williams ........... H01L 31/0352 136/256 |
| 2010/0255487 | A1* | 10/2010 | Beechem ............. C07H 19/20 435/6.12 |

OTHER PUBLICATIONS

Urban, J.J. Prospects for thermoelectricity in quantum dot hybrid arrays. Nature Nanotechnology 10, 997 (Dec. 2015).
Wang, R. Y., et al. Enhanced Thermopower in PbSe Nanocrystal Quantum Dot Superlattices. Nano Lett. 2008, 8, 2283-2288.
Kato, K., et al. Fabrication of Bismuth Telluride Thermoelectric Films Containing Conductive Polymers Using a Printing Method. J. Electron. Mater. 2013, 42, 1313-1318.
Kriegel, I, et al., "Tuning the Excitonic and Plasmonic Properties of Copper Chalcogenide Nanocrystals," J. Am. Chem.Soc. 2012, 134, 1583-1590.
Liu, H., et al., "Copper ion liquid-like thermoelectrics," Nature Materials 11, May 2012, 422-425.
Bell, L. E. Cooling, heating, generating power, and recovering waste heat with thermoelectric systems. Science 321, 1457-1461 (2008).
Coates, N. E. et al. Effect of interfacial properties on polymer-nanocrystal thermoelectric transport. Adv. Mater. 25, 1629-1633 (2013).
Zhuge, F. et al. Modulation of thermoelectric power factor via radial dopant inhomogeneity in B-doped Si nanowires. J. Amer. Chem. Soc. 136, 14100-14106 (2014).
Nag, A. et al. Metal-free inorganic ligands for colloidal nanocrystals: S2-, HS-, Se2-, HSe-, Te2-, HTe-, TeS32-, OH-, and NH2- as surface ligands. J. Amer. Chem. Soc. 133, 10612-10620 (2011).
Heremans, J. P. et al. Enhancement of thermoelectric efficiency in PbTe by distortion of the electronic density of states. Science 321, 554-557 (2008).
Yu, B. et al. Enhancement of thermoelectric properties by modulation-doping in silicon germanium alloy nanocomposites. Nano Lett. 12, 2077-2082 (2012).
Murray, C. B. et al. Synthesis and characterization of monodisperse nanocrystals and close-packed nanocrystal assemblies. Annu. Rev. Mater. Sci. 30, 545-610 (2000).
Rogers, J. A., et al. Materials and mechanics for stretchable electronics. Science 327, 1603-1607(2010).
Fang, H., et al. The effects of the size and the doping concentration on the power factor of n-type lead telluride nanocrystals for thermoelectric energy conversion. Nano Lett. 14, 1153-1157 (2014).
Yang, H. et al. Enhanced thermoelectric properties in bulk nanowire heterostructure-based nanocomposites through minority carrier blocking. Nano Lett. 15, 1349-1355 (2015).
Scheele, M. et al. Synthesis and thermoelectric characterization of Bi2Te3 nanoparticles. Adv. Fund. Mater. 19, 3476-3483 (2009).
Zhang, G. et al. Rational synthesis of ultrathin n-type Bi2Te3 nanowires with enhanced thermoelectric properties. Nano Lett. 12, 56-60 (2011).
Zhang, G. Q. et al. Design principle of telluride-based nanowire heterostructures for potential thermoelectric applications. Nano Lett. 12, 3627-3633 (2012).
Zhang, Q. et al. High thermoelectric performance by resonant dopant indium in nanostructured SnTe. Proc. Natl. Acad. Sci. USA 110, 13261-13266, (2013).
Talapin, D. V. & Murray, C. B. PbSe nanocrystal solids for n- and p-channel thin film field-effect transistors. Science 310, 86-89, (2005).
Chuang, C.-H. M., et al. Improved performance and stability in quantum dot solar cells through band alignment engineering. Nature Mater 13, 796-801 (2014).
Sahu, A., et al. Interface Engineering for High Performance Thermoelectric Nanocomposites, AIChE Annual Meeting, Nov. 20, 2014.
Sahu, A., et al. Interface Engineering for High Performance Thermoelectric Nanocomposites, MRS Fall 2014 Meeting, Dec. 4, 2014.
Snyder, G.J., et al. Improved thermoelectric cooling based on the Thomson effect. Physical Review B 86, 045202 (2012).

\* cited by examiner

GRADED THERMOELECTRIC MATERIALS

RELATED APPLICATIONS

This application claims priority to U.S. Provisional Patent Application Ser. No. 62/215,352, filed Sep. 8, 2015, to U.S. Provisional Patent Application Ser. No. 62/247,310, filed Oct. 28, 2015, to U.S. Provisional Patent Application Ser. No. 62/256,786, filed Nov. 18, 2015, to U.S. Provisional Patent Application Ser. No. 62/333,409, filed May 9, 2016, and to U.S. Provisional Patent Application Ser. No. 62/348,590, filed Jun. 10, 2016, all of which are herein incorporated by reference.

STATEMENT OF GOVERNMENT SUPPORT

This invention was made with government support under Contract No. DE-AC02-05CH11231 awarded by the U.S. Department of Energy and under Grant No. FA9550-12-1-0002 awarded by the Air Force Office of Scientific Research. The government has certain rights in this invention.

TECHNICAL FIELD

This disclosure relates generally to thermoelectric materials and more particularly to graded thermoelectric materials.

BACKGROUND

Performance of thermoelectric materials is quantified by a dimensionless thermoelectric figure of merit, $ZT=S^2 \times \sigma \times T/\lambda$, where S is the Seebeck coefficient, $\sigma$ is the electrical conductivity, T is the temperature, and $\lambda$ is the thermal conductivity. The term $S^2 \times \sigma$ is known as the power factor. Increasing the numerator or decreasing the denominator of ZT will improve the performance of a thermoelectric material.

The performance of bulk thermoelectric materials is temperature dependent and optimal only within a specific temperature range. It has been shown that having graded structures can improve overall module performance. However, building such graded structures is generally energy intensive. Further, material layers in such graded structures has been limited in minimal subdivision thickness (e.g., greater than 1 millimeter) as a result of both material property and module fabrication constraints.

DETAILED DESCRIPTION

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

The terms "about" or "approximate" and the like are synonymous and are used to indicate that the value modified by the term has an understood range associated with it, where the range can be ±10%, ±5%, or ±1%. The term "substantially" is used to indicate that a value is close to a targeted value, where close can mean, for example, the value is within 90% of the targeted value, within 95% of the targeted value, or within 99% of the targeted value.

Disclosed herein are novel thermoelectric materials with enhanced energy conversion efficiency for both power generation and active cooling applications.

Graded thermoelectric materials can be created that benefit from nontraditional bulk thermoelectric properties found in organic and organic/inorganic nanocomposite materials. In these graded thermoelectric materials, the properties of each region or layer can be optimally tuned for the locally established temperature gradient. For example, sections or regions through a thickness or along a length of a graded thermoelectric material may have different properties, with the properties being tuned to the expected temperature gradient in that section of the graded thermoelectric material. In such graded thermoelectric materials, nanometer scale subdivisions are possible. The methods described herein provide a route for developing high performance, solution-processable, and flexible thermoelectric generators and Peltier coolers using low-cost processing and earth-abundant materials.

Figure 1:
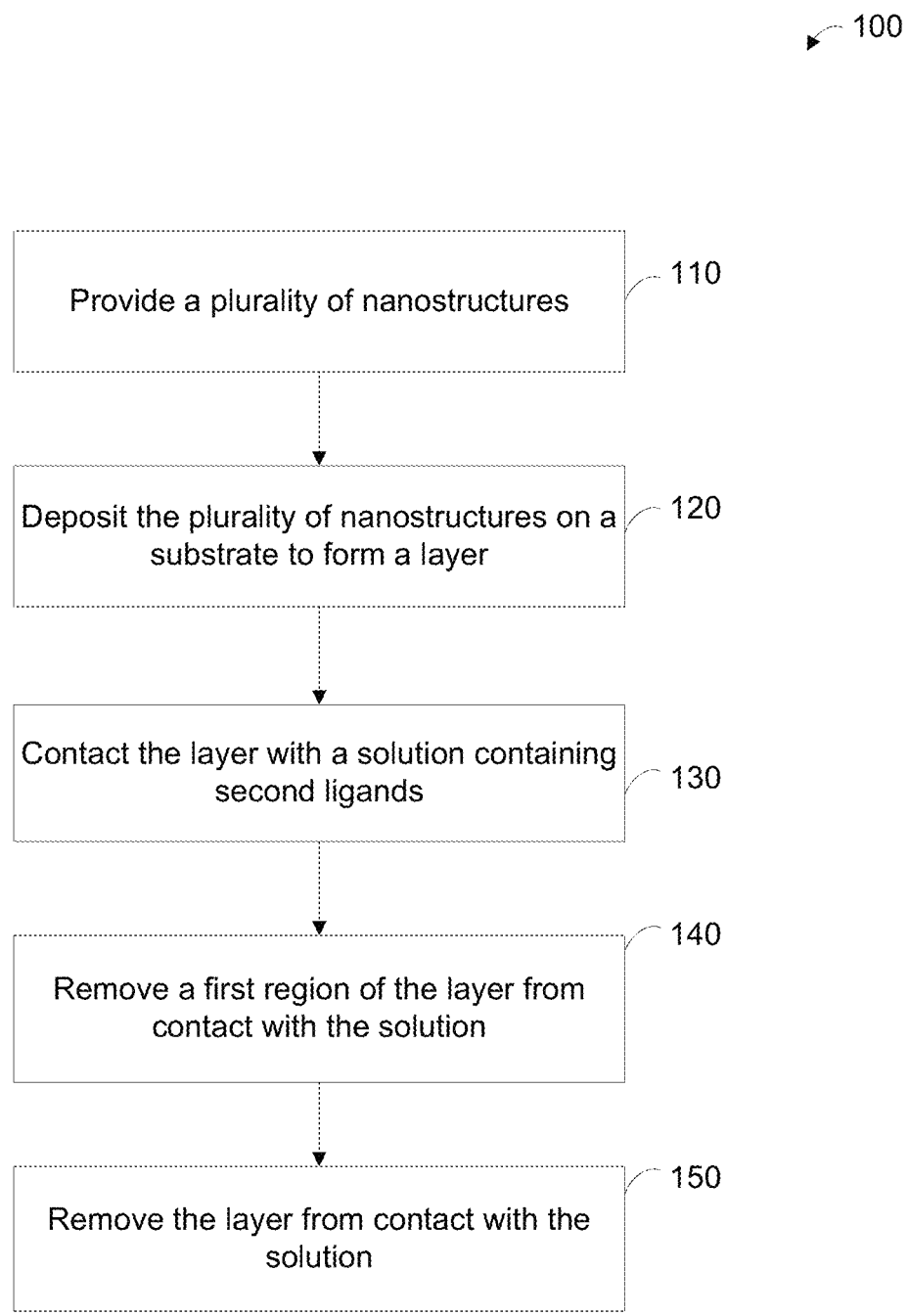
FIG. 1 shows an example of a flow diagram illustrating a manufacturing process for a graded thermoelectric material.
Figure 2A:
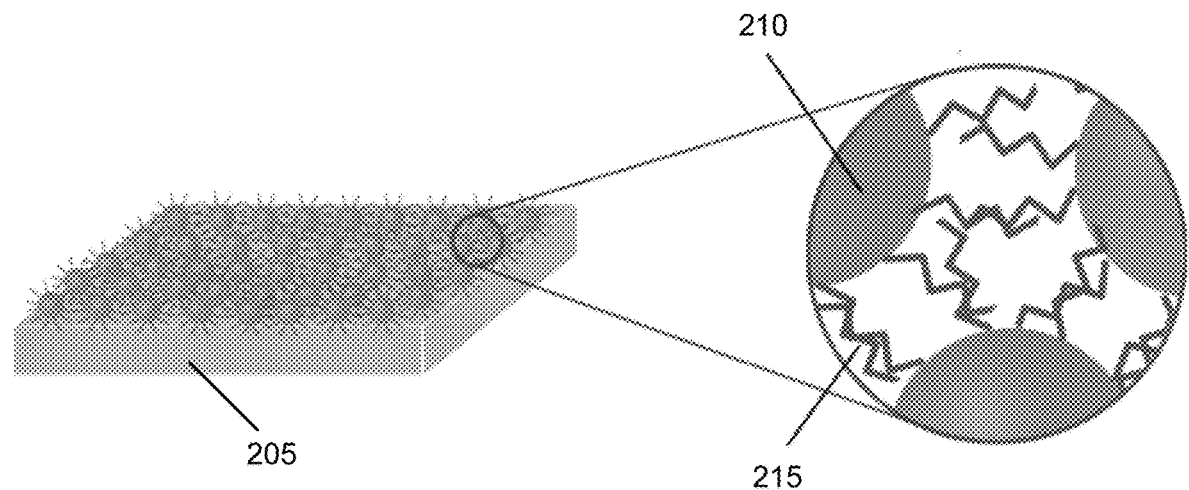
FIG. 2A shows an example of a schematic illustration of a thermoelectric material in a stage of making a graded thermoelectric material.
Figure 2B:
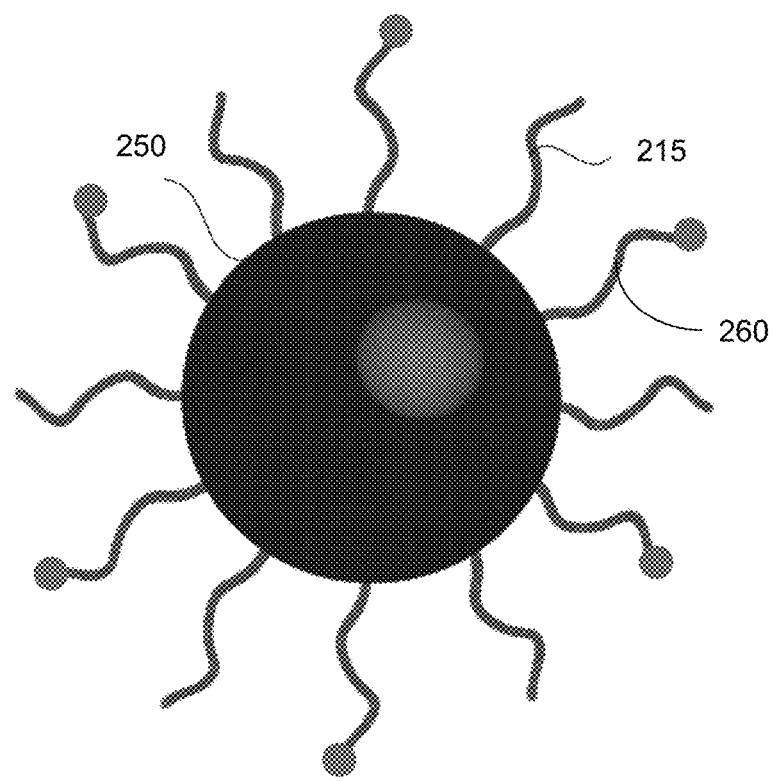
FIG. 2B shows an example of a schematic illustration of a nanostructure in a stage of making a graded thermoelectric material.

FIG. 1 shows an example of a flow diagram illustrating a manufacturing process for a graded thermoelectric material. FIG. 2A shows an example of a schematic illustration of a thermoelectric material in a stage of making a graded thermoelectric material. FIG. 2B shows an example of a schematic illustration of a nanostructure in a stage of making a graded thermoelectric material. Starting at block 110 of the method 100, a plurality of nanostructures is provided. The plurality of nanostructures comprises a thermoelectric material. Nanostructures of the plurality of nanostructures have first ligands disposed on surfaces of the nanostructures.

In some embodiments, the largest dimension of a nanostructure of the plurality of nanostructures is about 5 nanometers (nm) to 50 nm. For example, the largest dimension of a spherical nanostructure is the diameter of the nano structure. In some embodiments, the nanostructures are monodisperse; i.e., in some embodiments, the nanostructures have a narrow size range. In some embodiments, the nanostructures comprise nanostructures selected from a group consisting of nanorods, nanowires, nanoparticles, nanosheets, nanoplates, and quantum dots. In some embodiments, the nanostructures comprise copper selenide ($Cu_2Se$), copper telluride, copper sulfide, bismuth selenide, bismuth telluride, bismuth sulfide, lead selenide, lead telluride, lead sulfide, bismuth, tellurium, silicon, silver telluride, silver selenide, antimony selenide, antimony telluride, or alloys thereof. In some embodiments, the nanostructures comprise a nonstoichiometric composition. For example, the nanostructures may comprise $Cu_{2-x}Se$, with x generally being about 0.01 and 0.20.

In some embodiments, after the nanostructures are fabricated, each nanostructure of the plurality of nanostructures has first ligands disposed on a surface of the nanostructure. In some embodiments, the first ligands generally comprise amines, phosphines, phosphonic acids, phosphine oxides, or carboxylic acids. For example, the first ligands may comprise oleylamine, oleic acid, octylamine, hexylamine, trioctylphosphine, tributylphosphine, trioctylphosphine oxide, hexadecylamine, octadecylamine, dodecylphosphonic acid, or tetradecylphosphonic acid.

In some embodiments, the nanostructures are fabricated by mixing a first solution a metal salt in an organic solvent with a second solution of a chalcogen (e.g., sulfur, selenium, tellurium) in an organic solvent. In some embodiments, the metal salt comprises a copper salt (e.g., copper chloride, copper nitrate, copper sulfate, copper acetate, copper acetylacetonate, copper methoxide, copper ethylhexanoate, copper tetrafluoroacetate, copper hexafluoroacetylacetonate). In some embodiments, the organic solvent of the first solution is the same as the organic solvent of the second solution. In some embodiments, the organic solvent of the first solution and the organic solvent of the second solution are miscible.

In an example embodiment, copper selenide ($Cu_{2-x}Se$) nanocrystals were synthesized following a modified version of the method described in Kriegel, I. et al., Tuning the Exitonic and Plasmonic Properties of Copper Chalcogenide Nanocrystals, *J. Am. Chem. S.* 134, 1583-1590 (2012). Briefly, a solution of copper (I) chloride in oleylamine (OAm) and 1-octadecene (ODE) was injected into a solution of selenium dissolved in the same solvents at a temperature of 310° C. The reaction was allowed to proceed for 20 minutes at 300° C. 11.8±1.1 nm diameter nanocrystals were formed. The nanocrystals were washed by precipitating with ethanol and resuspending in hexane twice. The nanocrystals were kept in hexane for future use.

At block 120, the plurality of nanostructures is deposited on a substrate to form a layer. In some embodiments, the nanostructures are suspended in a solution prior to performing block 120. In some embodiments, the nanostructures are deposited on the substrate using a solution processing technique. For example, solution processing techniques include spin coating, dip coating, spray coating, doctor blade, and inkjet printing. In some embodiments, the substrate comprises a silicon substrate or a glass substrate. In some embodiments, a layer of about 10 nm to 20 nm may be formed by performing block 120 a single time. In some embodiments, block 120 is repeated to generate a layer of nanostructures having a specified thickness. For example, block 120 may be performed to form a first layer of nanostructures. Block 120 could then be repeated to form a second layer of nanostructures disposed on the first layer of nanostructures. In some embodiments, the layer has a final thickness (i.e., the thickness of the layer after performing block 120 more than one time) of about 10 nm to 1 micron, about 1 microns to 10 microns, or about 10 microns to 10 millimeters (mm).

In some embodiments, after depositing the plurality of nanostructures, solvent from the solution in which the nanostructures were suspended is removed in a drying process. For example, the drying process may include heating the layer to about 30° C. to 100° C., or about 70° C.

FIG. 2A shows an example of schematic illustrations of a nanostructured layer of a thermoelectric material after block 120. As shown in FIG. 2A, a plurality of nanostructures 210 is disposed on a substrate 205. First ligands 215 attached to surfaces of each nanostructure of the plurality of nanostructures control the spacing between the nanostructures.

Turning back to FIG. 1, at block 130, the layer is contacted with a solution containing second ligands. For example, in some embodiments, the layer is contacted with the solution containing second ligands by immersing the layer in the solution. A ligand exchange process occurs where some of the first ligands disposed on the plurality of nanostructures are replaced with the second ligands. The nanostructures should not be soluble in the solvent of the solution containing the second ligands.

In some embodiments, the first ligands have a longer chain length than the second ligands. For example, in some embodiments, the first ligands are long, insulating ligands that are useful for solubilizing the nanostructures, and the second ligands are shorter ligands. In some embodiments, the second ligands comprise ethanedithiol, ethylenediamine, succinic acid, propionic acid benzenedithiolate, benzenediamine, hydrazine, ammlonium thiocyanate, sodium hydroxide, potassium hydroxide, sodium sulfide, potassium sulfide, sodium hydrosulfide, potassium hydrosulfide, ammonium sulfide, sodium telluride, potassium telluride, sodium hydrotelluride, potassium hydrotelluride, sodium selenide, sodium hydroselenide, potassium selenide, potassium hydroselenide, nitrosonium tetrafluoroborate, mercaptopropionic acid, formic acid, chalcogenidometallates (ChaMs), or polyoxometalates (POMs). In some embodiments, the second ligands have a stronger binding energy to the nanostructures than the first ligands.

FIG. 2B shows an example of a schematic illustration of a nanostructure of the plurality of nanostructures after block 130. A nanostructure 250 includes first ligands 215 and second ligands 260 disposed on a surface of the nanostructure 250. The nanostructure 250 is one of the plurality of nanostructures 210 disposed on the substrate.

Turning back to FIG. 1, at block 140, a first region of the layer is removed from contact with the solution so that the ligand exchange process does not occur in the first region of the layer. The ligand exchange process proceeds in the layer in contact with the solution, with some of the first ligands disposed on the plurality of nanostructures in the layer in contact with the solution being replaced with the second ligands. For example, in some embodiments, the layer is immersed in the solution at block 130. A first region of the layer may be with withdrawn from contact with the solution at block 140.

In some embodiments, each of the operations 130 and 140 occurs for a period of time of about 1 minute to 10 minutes. In some embodiments, depending on the solvent of the solution and the concentration of second ligands in the solution, each of the operations 130 and 140 occurs for a period of time of about 1 second to 10 hours.

At block 150, the layer is removed from contact with the solution. The ligand exchange process does not occur in any region of the layer.

In some embodiments, after block 150, solvent of the solution is removed from the layer in a drying process. For example, in some embodiments, the drying process includes heating the layer to about 30° C. to 100° C., or about 70° C.

In some embodiments, after block 150, the layer is thermally annealed. In some embodiments, the thermal annealing is performed at a temperature of about 50° C. to 600° C. In some embodiments, the thermal annealing is performed at a temperature at or below about 500° C. In some embodiments, the thermal annealing is performed at a temperature of about 300° C. or about 400° C. In some embodiments, the thermal annealing is performed for about 15 minutes to 1 hour, or about 45 minutes. In some embodiments, the thermal annealing is performed in air. In some embodiments, the thermal annealing is performed in a specified atmosphere, such as an inert atmosphere. For example, in some embodiments, the thermal annealing is performed in an atmosphere comprising a gas selected from a group consisting of nitrogen, argon, hydrogen, oxygen, and mixtures thereof.

In some embodiments, the thermal annealing removes at least some of the first ligands and the second ligands from the surface of each nanostructure of the plurality of nanostructures. In some embodiments, the thermal annealing removes all of the first ligands and the second ligands from the surface of each nanostructure of the plurality of nanostructures. In some embodiments, some of the surfaces of the nanostructures are in contact with each other after the thermal annealing. For example, a thermoelectric material surface of a first nanostructure may be in contact with a thermoelectric material surface of a second nanostructure. In some embodiments, the thermal annealing modifies the first ligands and the second ligands and the modified first ligands and the modified second ligands form a layer of a material on a surface of each nanostructure of the plurality of nanostructures. For example, during the thermal annealing, the first ligands and the second ligands may become mobile and form a layer of ligand molecules on a surface of each nanostructure of the plurality of nanostructures.

In some embodiments, the method 100 is used to form a graded thermoelectric material including two regions having different thermoelectric properties. In some embodiments, a graded thermoelectric material includes a first region and a second region. The first region of the material may have a first Seebeck coefficient $S_1$ and a first electrical conductivity $\sigma_1$. The second region of the material may have a second Seebeck coefficient $S_2$ and a second electrical conductivity $\sigma_2$.

For a graded thermoelectric material fabricated with the method 100, the second region, having been in contact with the solution for a longer period of time compared to the first region, will have more second ligands attached to the nanostructures in the second region. For example, the first region of the material may include a first plurality of nanostructures, with nanostructures of the first plurality of nanostructures having first ligands and second ligands disposed on surfaces of the nanostructures. The second region of the material includes a second plurality of nanostructures. Nanostructures of the second plurality of nanostructures have first ligands and second ligands disposed on surfaces of the nanostructures. A percentage of the first ligands disposed on the nanostructures in the first plurality of nanostructures is higher than a percentage of the first ligands disposed on the nanostructures in the second plurality of nanostructures. A percentage of the second ligands disposed on the nanostructures of the first plurality of nanostructures is lower than a percentage of the second ligands disposed on the nanostructures of the second plurality of nanostructures. In some embodiments, the first plurality of nanostructures is in contact with the second plurality of nanostructures.

In some embodiments, the second region (i.e., the region with a greater percentage of second ligands) has a higher electrical conductivity than the first region. When the second ligands are shorter than the first ligands, the nanostructures in the second region may be packed closer to one another due to the greater percentage of second ligands in the second region. This may contribute to the higher electrical conductivity. In some embodiments, the second region (i.e., the region with a greater percentage of second ligands) has a lower Seebeck coefficient than the first region. The nanostructures in the second region may have more charge available (e.g., due to a surface doping effect of the second ligands) to each nanostructure due to the higher percentage of second ligands. This may contribute to the lower Seebeck coefficient.

In some embodiments, a graded thermoelectric material includes about 2 regions to 10 regions, or about 2 regions to 5 regions, with each region having different thermoelectric properties. The method 100 shown in FIG. 1 can be used to create a graded thermoelectric material having two regions. Further regions can be removed from contact with the solution while some of the layer remains in contact with the solution to create a graded thermoelectric material having more than two regions.

For example, in the method 100 shown in FIG. 1, after block 140, a second region of the layer may be removed from contact with the solution in addition to the first layer being removed from contact with the solution. The ligand exchange process does not occur in the first region of the layer and the second region of the layer. The ligand exchange process occurs in the layer in contact with the solution where some of the first ligands disposed on the plurality of nanostructures on the region of the layer in contact with the solution are replaced with the second ligands. This would form a graded thermoelectric material having three regions, with each region having different thermoelectric properties.

In an example embodiment of the method 100, $Cu_2Se$ nanoparticles with oleylamine ligands disposed on surfaces of the $Cu_2Se$ nanoparticles were deposited on a substrate. During the deposition process, the $Cu_2Se$ nanoparticles were suspend in a solution including hexane, octane, or a mixture thereof. A solution of hydrazine in an aqueous solvent was contacted to the layer. The solution could also be hydrazine in a polar solvent, such as methanol. The oleylamine ligands on the surfaces of the $Cu_2Se$ nanoparticles were exchanged for the hydrazine ligands. Different regions of the layer of $Cu_2Se$ nanoparticles were fabricated.

Figure 3:
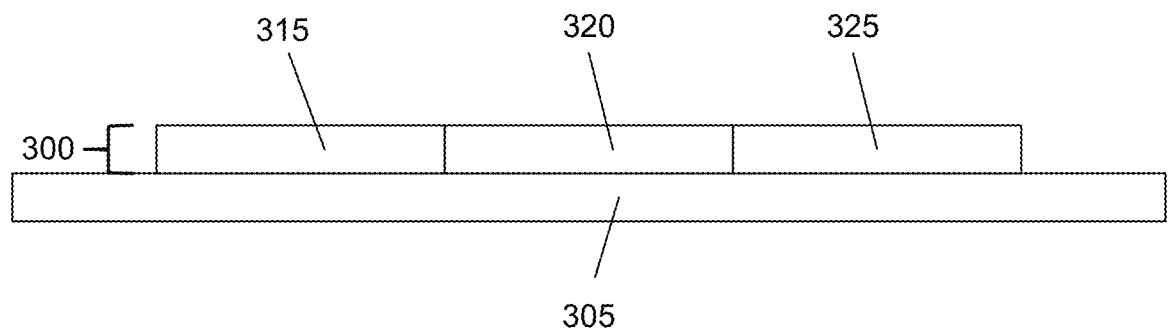
FIG. 3 shows an example of a graded thermoelectric material.

FIG. 3 shows an example of a graded thermoelectric material. The graded thermoelectric material 300 shown in FIG. 3 is disposed on a substrate 305. In some embodiments, the substrate comprises a silicon substrate or a glass substrate. The graded thermoelectric material 300 includes a first region 315, a second region 320, and a third region 325, with each region having different thermoelectric properties (e.g., Seebeck coefficient and electrical conductivity). In some embodiments, the graded thermoelectric material 300 has a thickness of about 10 nm to 1 micron.

The first region 315 of the material 300 includes a first plurality of nanostructures. The second region 320 of the material 300 includes a second plurality of nanostructures. The third region 325 of the material 300 includes a third plurality of nanostructures. In some embodiments, the first region 315 including the first plurality of nanostructures is in contact with the second region 320 including the second plurality of nanostructures. In some embodiments, the second region 320 including the second plurality of nanostructures is in contact with the third region 325 including the third plurality of nanostructures. In some embodiments, a length of a region (i.e., the first region 315, the second region 320, or the third region 325) is about 1 micron to 100 microns.

Nanostructures of the first plurality of nanostructures have first ligands and second ligands disposed on surfaces of the nanostructures. Nanostructures of the second plurality of nanostructures have first ligands and second ligands disposed on surfaces of the nanostructures. A percentage of the first ligands disposed on the nanostructures in the first plurality of nanostructures is higher than a percentage of the first ligands disposed on the nanostructures in the second plurality of nanostructures. A percentage of the second ligands disposed on the nanostructures in the first plurality of nanostructures is lower than a percentage of the second ligands disposed on the nanostructures in the second plurality of nanostructures.

Nanostructures of the third plurality of nanostructures have first ligands and second ligands disposed on surfaces of the nanostructures. A percentage of the first ligands disposed on the nanostructures in the second plurality of nanostructures is higher than a percentage of the first ligands disposed on the nanostructures in the third plurality of nanostructures. A percentage of the second ligands disposed on the surfaces of the nanostructures in the second plurality of nanostructures is lower than a percentage of the second ligands disposed on the surfaces of the nanostructures in the third plurality of nanostructures.

In some embodiments, for nanostructures of each of the plurality of nanostructures, the largest dimension of a nanostructure is about 5 nm to 50 nm. In some embodiments, the nanostructures are monodisperse; i.e., in some embodiments, the nanostructures have a narrow size range. In some embodiments, the nanostructures comprise nanostructures selected from a group consisting of nanorods, nanowires, nanoparticles, nanosheets, nanoplates, and quantum dots. In some embodiments, nanostructures of each of the plurality of nano structures comprise a thermoelectric material. In some embodiments, nanostructures of each of the plurality of nanostructures comprise the same thermoelectric material. In some embodiments, nanostructures of each of the plurality of nanostructures comprise copper selenide ($Cu_2Se$), copper telluride, copper sulfide, bismuth selenide, bismuth telluride, bismuth sulfide, lead selenide, lead telluride, lead sulfide, bismuth, tellurium, silicon, silver telluride, silver selenide, antimony selenide, antimony telluride, or alloys thereof. In some embodiments, the nanostructures comprise a nonstoichiometric composition. For example, the nanostructures may comprise $Cu_{2-x}Se$, with x generally being about 0.01 and 0.20.

In some embodiments, the first ligands generally comprise amines, phosphines, phosphonic acids, phosphine oxides, or carboxylic acids. For example, the first ligands may comprise oleylamine, oleic acid, octylamine, hexylamine, trioctylphosphine, tributylphosphine, trioctylphosphine oxide, hexadecylamine, octadecylamine, dodecylphosphonic acid, or tetradecylphosphonic acid. In some embodiments, the second ligands comprise ethanedithiol, ethylenediamine, succinic acid, propionic acid benzenedithiolate, benzenediamine, hydrazine, ammlonium thiocyanate, sodium hydroxide, potassium hydroxide, sodium sulfide, potassium sulfide, sodium hydrosulfide, potassium hydrosulfide, ammonium sulfide, sodium telluride, potassium telluride, sodium hydrotelluride, potassium hydrotelluride, sodium selenide, sodium hydroselenide, potassium selenide, potassium hydroselenide, nitrosonium tetrafluoroborate, mercaptopropionic acid, formic acid, chalcogenidometallates (ChaMs), or polyoxometalates (POMs). In some embodiments, the first ligands have a longer chain length than the second ligands.

In some embodiments, a graded thermoelectric material includes a region of the layer in contact with the first region, with nanostructures in this region only having first ligands disposed on surfaces of the nanostructures. No second ligands are disposed on the surfaces of the nanostructures in this region. Such a graded thermoelectric material could be fabricated by not contacting the entire layer with the solution including the second ligands. The first ligand only region could be fabricated by not contacting a region of the layer with the solution. The first ligand only region would be in contact with the first region 315 in FIG. 3; i.e., the first ligand only region would be in contact with the region having the highest percentage of the first ligands disposed on surfaces of the nanostructures and the lowest percentage of the second ligands disposed on surfaces of the nanostructures.

Figure 4:
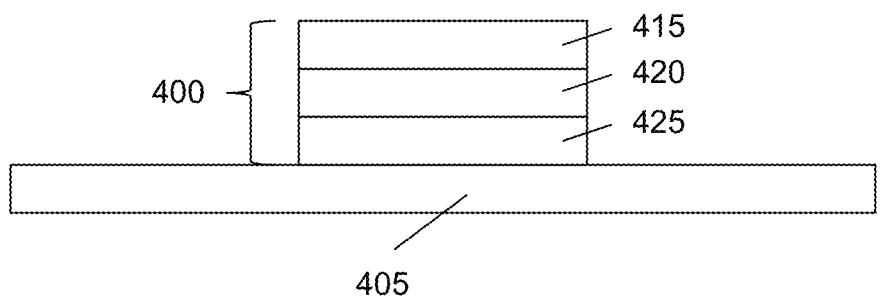
FIG. 4 shows an example of a graded thermoelectric material.

In some embodiments, as shown in FIG. 3, the first region 315 including the first plurality of nanostructures, the second region 320 including the second plurality of nanostructures, and the third region 325 including the third plurality of nanostructures are each disposed on a substrate 305. Other configurations are also possible. FIG. 4 shows an example of a graded thermoelectric material 400. A first region 415 including a first plurality of nanostructures is disposed on a substrate 405. A second region 420 including a second plurality of nanostructures is disposed on the first region 415 including the first plurality of nanostructures. A third region 425 including a third plurality of nanostructures is disposed on the second region 420 including the second plurality of nanostructures. In some embodiments, the first region 415, the second region 420, and the third region 425 include the same or similar nanostructures, materials, first ligands, and second ligands as the first region 315, the second region 320, and the third region 325 described above with respect to the graded thermoelectric material 300 shown in FIG. 3.

In some embodiments, the graded thermoelectric material 400 has a thickness of about 10 microns to 10 millimeters. In some embodiments, in a top-down view of the graded thermoelectric material 400, the graded thermoelectric material 400 has dimensions of about 10 microns to 10 millimeters by about 10 microns to 10 millimeters. In some embodiments, each region 415, 420, and 425 of the graded thermoelectric material 400 has a thickness of about 5 microns to 2 millimeters.

Figure 5:
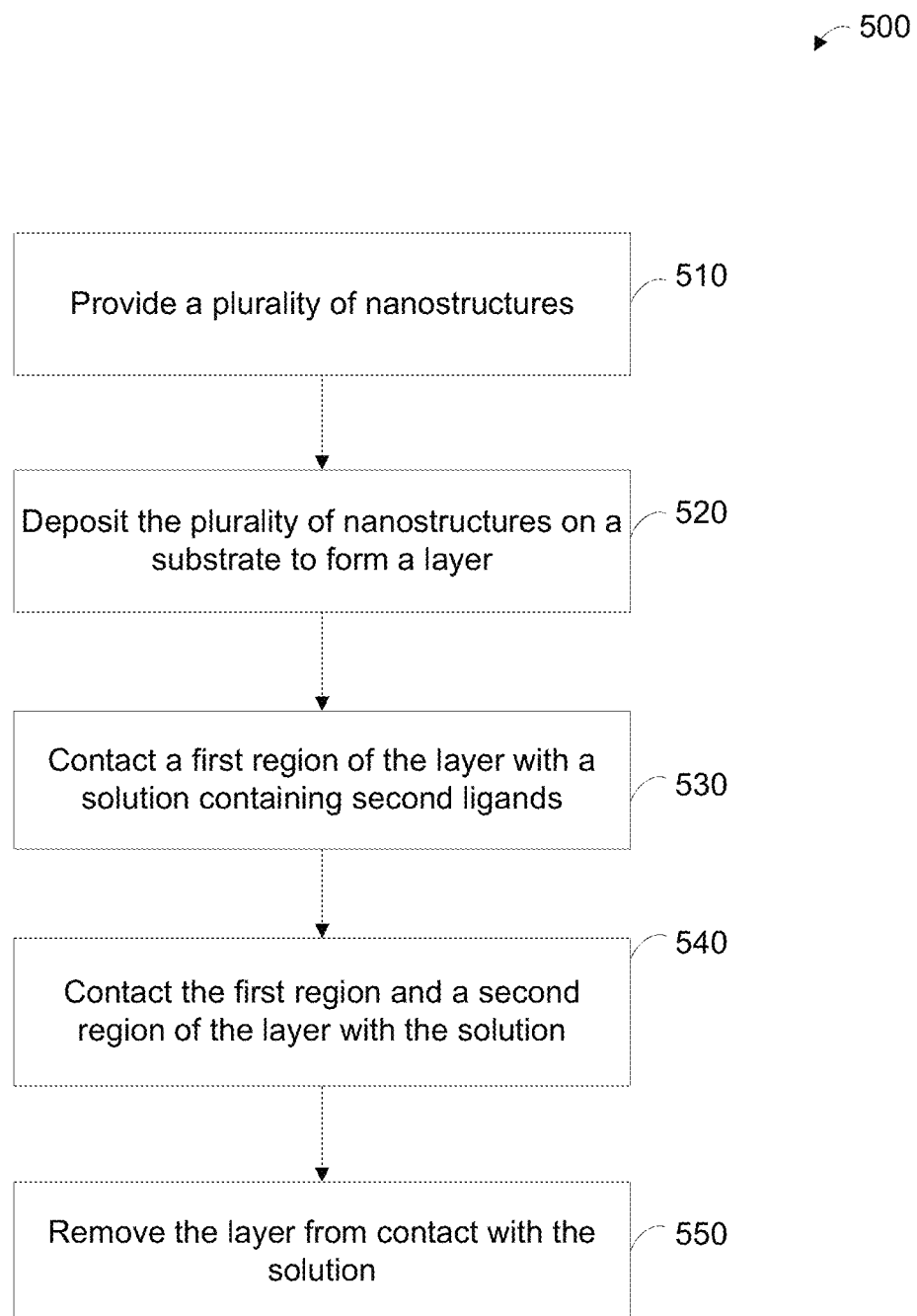
FIG. 5 shows an example of a flow diagram illustrating a manufacturing process for a graded thermoelectric material.

FIG. 5 shows an example of a flow diagram illustrating a manufacturing process for a graded thermoelectric material. In some embodiments, the method 500 shown in FIG. 5 uses the same or similar materials and the same or similar operations as described above with respect the method 100 shown in FIG. 1. Further, the method 500 can be used to fabricate the graded thermoelectric materials 300 and 400 shown in FIGS. 3 and 4, respectively.

Starting at block 510 of the method 500, a plurality of nanostructures is provided. The plurality of nanostructures comprises a thermoelectric material. Nanostructures of the plurality of nanostructures have first ligands disposed on surfaces of the nanostructures.

At block 520, the plurality of nanostructures is deposited on a substrate to form a layer. In some embodiments, the nanostructures are deposited on the substrate using a solution processing technique. For example, solution processing techniques include spin coating, dip coating, spray coating, doctor blade, and inkjet printing.

In some embodiments, after depositing the plurality of nanostructures, solvent from the solution in which the nanostructures were suspended is removed in a drying process. For example, the drying process may include heating the layer to about 30° C. to 100° C., or about 70° C.

At block 530, a first region of the layer is contacted with a solution containing second ligands. For example, in some embodiments, the first region of the layer is contacted with the solution containing second ligands by immersing the first region of the layer in the solution. A ligand exchange process occurs in which some of the first ligands disposed on the plurality of nanostructures in the first region are replaced with the second ligands.

At block 540, the first region and a second region of the layer are contacted with the solution. For example, in some embodiments, the first region and the second region of the layer are contacted with the solution containing second ligands by immersing the first region and the second region of the layer in the solution. A ligand exchange process occurs where the first ligands disposed on the plurality of nanostructures in the first region and the second region are replaced with the second ligands. In some embodiments, the first region of the layer is adjacent to and in contact with the second region of the layer.

At block 550, the layer is removed from contact with the solution. The ligand exchange process does not occur in any region of the layer.

In some embodiments, after block 550, solvent of the solution is removed from the layer in a drying process. For example, the drying process may include heating the layer to about 30° C. to 100° C., or about 70° C. In some embodiments, after block 550, the layer is thermally annealed, as described above with respect to the method 100. For example, in some embodiments, the thermal annealing is performed at a temperature of about 50° C. to 600° C.

Similar to the method 100, the method 500 can be used to create multiple regions in a graded thermoelectric material. For example, in some embodiments, after block 540, the first region, the second region, and a third region of the layer are contacted with the solution. A ligand exchange process occurs where the first ligands disposed on the plurality of nanostructures in the first region, the second region, and the third region are replaced with the second ligands.

Also similar to the method 100, the method 500 can be used to fabricate a graded thermoelectric material having a region of the layer only having first ligands disposed on surfaces of the nanostructures. In some embodiments, this first ligand only region is in contact with the region of the layer having the highest percentage of the first ligands disposed on the nanostructures and the lowest percentage of the second ligands disposed on the nanostructures. In the method 500 described with respect to FIG. 5, this would be the second region.

Figure 6:
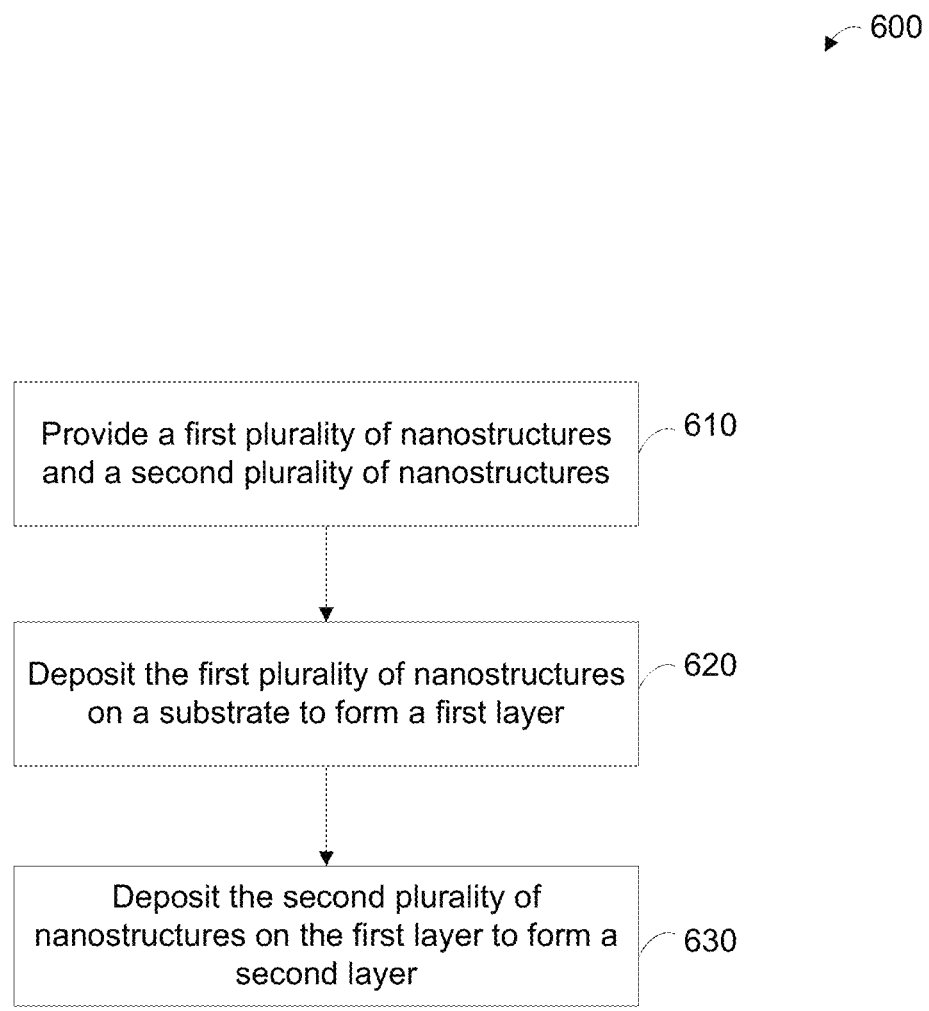
FIG. 6 shows an example of a flow diagram illustrating a manufacturing process for a graded thermoelectric material.

FIG. 6 shows an example of a flow diagram illustrating a manufacturing process for a graded thermoelectric material. In some embodiments, the method 600 shown in FIG. 6 uses the same or similar materials and the same or similar operations as described above with respect the method 100 shown in FIG. 1. Further, the method 600 can be used to fabricate the graded thermoelectric materials 300 and 400 shown in FIGS. 3 and 4, respectively.

Starting at block 610 of the method 600, a first plurality of nanostructures and a second plurality of nanostructures are provided. The first plurality of nanostructures and the second plurality of nanostructures comprise a thermoelectric material. Nanostructures of the first plurality of nanostructures and the second plurality of nanostructures have first ligands and second ligands disposed on surfaces of the nanostructures. A percentage of the first ligands disposed on the nanostructures in the first plurality of nanostructures is higher than a percentage of the first ligands disposed on the nanostructures in the second plurality of nanostructures. A percentage of the second ligands disposed on the nanostructures in the first plurality of nanostructures is lower than a percentage of the second ligands disposed on the nanostructures in the second plurality of nanostructures.

In some embodiments, the largest dimension of a nanostructure of the first and the second plurality of nanostructures is about 5 nm to 50 nm. For example, the largest dimension of a spherical nanostructure is the diameter of the nanostructure. In some embodiments, the nanostructures are monodisperse; i.e., in some embodiments, the nanostructures have a narrow size range. In some embodiments, the nanostructures comprise nanostructures selected from a group consisting of nanorods, nanowires, nanoparticles, nanosheets, nanoplates, and quantum dots. In some embodiments, the nanostructures comprise copper selenide ($Cu_2Se$), copper telluride, copper sulfide, bismuth selenide, bismuth telluride, bismuth sulfide, lead selenide, lead telluride, lead sulfide, bismuth, tellurium, silicon, silver telluride, silver selenide, antimony selenide, antimony telluride, or alloys thereof. In some embodiments, the nanostructures comprise a nonstoichiometric composition. For example, the nanostructures may comprise $Cu_{2-x}Se$, with x generally being about 0.01 and 0.20.

In some embodiments, the first ligands generally comprise amines, phosphines, phosphonic acids, phosphine oxides, or carboxylic acids. For example, in some embodiments, the first ligands comprise oleylamine, oleic acid, octylamine, hexylamine, trioctylphosphine, tributylphosphine, trioctylphosphine oxide, hexadecylamine, octadecylamine, dodecylphosphonic acid, or tetradecylphosphonic acid. In some embodiments, the second ligands comprise ethanedithiol, ethylenediamine, succinic acid, propionic acid benzenedithiolate, benzenediamine, hydrazine, ammlonium thiocyanate, sodium hydroxide, potassium hydroxide, sodium sulfide, potassium sulfide, sodium hydrosulfide, potassium hydrosulfide, ammonium sulfide, sodium telluride, potassium telluride, sodium hydrotelluride, potassium hydrotelluride, sodium selenide, sodium hydroselenide, potassium selenide, potassium hydroselenide, nitrosonium tetrafluoroborate, mercaptopropionic acid, formic acid, chalcogenidometallates (ChaMs), or polyoxometalates (POMs). In some embodiments, the first ligands have a longer chain length than the second ligands.

In some embodiments, after the nanostructures are fabricated, each nanostructure of the plurality of nanostructures has first ligands disposed on a surface of the nanostructure. In some embodiments, for nanostructures in the first and the second plurality of nanostructures, the first ligands are exchanged for the second ligands in a solution including the second ligands. The ligand exchange process is allowed to occur for different periods of time to obtain the different percentages of the first ligands and the second ligands in the first plurality of nanostructures and the second plurality of nanostructures. For example, nanostructures for which the ligand exchange process is allowed to occur for a longer period of time will have a lower percentage of first ligands and a higher percentage of second ligands disposed on surfaces of the nano structures.

At block 620, the first plurality of nanostructures is deposited on a substrate to form a first layer. In some embodiments, the first plurality of nanostructures is deposited on the substrate using a solution processing technique. For example, solution processing techniques include spin coating, dip coating, spray coating, doctor blade, and inkjet printing. In some embodiments, the substrate comprises a silicon substrate or a glass substrate. In some embodiments, a layer of about 10 nm to 20 nm may be formed be performing block 620 a single time. In some embodiments, block 620 is repeated to form a layer of nanostructures having a specified thickness. In some embodiments, the layer of the first plurality of nanostructures has a final thickness (i.e., the thickness of the layer after performing block 620 more than one time) of about 10 nm to 1 micron, about 1 micron to 10 microns, or about 10 microns to 10 mm.

At block 630, the second plurality of nanostructures is deposited on the first layer to form a second layer. In some embodiments, the second plurality of nanostructures is deposited using a solution processing technique. In some embodiments, a layer of about 10 nm to 20 nm may be formed be performing block 630 a single time. In some embodiments, block 630 is repeated to form a layer of nanostructures having a specified thickness. In some embodiments, the layer of the second plurality of nanostructures has a final thickness (i.e., the thickness of the layer after performing block 630 more than one time) of about 10 nm to 1 micron, about 1 micron to 10 microns, or about 10 microns to 10 mm.

In some embodiments, after block 620 and/or block 630, solvent from the solution in which the nanostructures were suspended is removed in a drying process. For example, the drying process may include heating the layer to about 30° C. to 100° C., or about 70° C.

In some embodiments, after block 630, the graded thermoelectric material is thermally annealed. In some embodiments, the thermal annealing is performed at a temperature of about 50° C. to 600° C. In some embodiments, the thermal annealing is performed at a temperature at or below about 500° C. In some embodiments, the thermal annealing is performed at a temperature of about 300° C. or about 400° C. In some embodiments, the thermal annealing is performed for about 15 minutes to 1 hour, or about 45 minutes. In some embodiments, the thermal annealing is performed in air. In some embodiments, the thermal annealing is performed in a specified atmosphere, such as an inert atmosphere. For example, in some embodiments, the thermal annealing is performed in an atmosphere comprising a gas selected from a group consisting of nitrogen, argon, hydrogen, oxygen, and mixtures thereof.

In some embodiments, after block 630, a third plurality of nanostructures is deposited on the second layer to form a third layer. The third plurality of nanostructures comprises the thermoelectric material. Nanostructures of the third plurality of nanostructures have first ligands and second ligands disposed on surfaces of the nano structures. The percentage of the first ligands disposed on the nanostructures in the second plurality of nanostructures is higher than a percentage of the first ligands disposed on the nanostructures in the third plurality of nanostructures. The percentage of the second ligands disposed on the surfaces of the nanostructures in the second plurality of nanostructures is lower than a percentage of the second ligands disposed on the surfaces of the nanostructures in the third plurality of nanostructures.

Conclusion

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A method of fabricating a graded thermoelectric material, comprising:
    (a) providing a plurality of nanostructures, the plurality of nanostructures comprising a thermoelectric material, nanostructures of the plurality of nanostructures having first ligands disposed on surfaces of the nanostructures;
    (b) depositing the plurality of nanostructures on a substrate to form a layer;
    (c) contacting the layer with a solution containing second ligands, a ligand exchange process occurring where some of the first ligands disposed on the plurality of nanostructures are replaced with the second ligands;
    (d) removing a first region of the layer from contact with the solution so that the ligand exchange process does not occur in the first region of the layer, the ligand exchange process occurring in the layer in contact with the solution where some of the first ligands disposed on the plurality of nanostructures in the layer in contact with the solution are replaced with the second ligands, the first region having a length of about 1 micron to 100 microns or having a thickness of about 5 microns to 2 millimeters; and
    (e) removing the layer from contact with the solution.

2. The method of claim 1, further comprising:
    after operation (d), removing a second region of the layer from contact with the solution in addition to the first region being removed from contact with the solution so that the ligand exchange process does not occur in the first region of the layer and the second region of the layer, wherein the ligand exchange process occurs in the layer in contact with the solution where some of the first ligands disposed on the plurality of nanostructures in the region of the layer in contact with the solution are replaced with the second ligands.

3. The method of claim 1, further comprising:
    thermally annealing the layer.

4. The method of claim 1, wherein the plurality of nanostructures comprises $Cu_2Se$ or $Cu_{2-x}Se$.

5. The method of claim 1, wherein the plurality of nanostructure comprises nanoparticles.

6. The method of claim 1, wherein the first ligands comprise oleylamine ligands.

7. The method of claim 1, wherein the second ligands comprise hydrazine ligands.

8. The method of claim 1, wherein the first ligands have a longer chain length than the second ligands.

9. A method of fabricating a graded thermoelectric material, comprising:
    (a) providing a plurality of nanostructures, the plurality of nanostructures comprising a thermoelectric material, nanostructures of the plurality of nanostructures having first ligands disposed on surfaces of the nanostructures;
    (b) depositing the plurality of nanostructures on a substrate to form a layer;
    (c) contacting a first region of the layer with a solution containing second ligands, a ligand exchange process occurring in which some of the first ligands disposed on the plurality of nanostructures in the first region are replaced with the second ligands, the first region having a length of about 1 micron to 100 microns or having a thickness of about 5 microns to 2 millimeters;

(d) contacting the first region and a second region of the layer with the solution, a ligand exchange process occurring where the first ligands disposed on the plurality of nanostructures in the first region and the second region are replaced with the second ligands; and (e) removing the layer from contact with the solution.

10. The method of claim 9, further comprising:
after operation (d), contacting the first region, the second region, and a third region of the layer with the solution, a ligand exchange process occurring where the first ligands disposed on the plurality of nanostructures in the first region, the second region, and the third region are replaced with the second ligands.

11. The method of claim 9, further comprising:
thermally annealing the layer.

12. The method of claim 9 wherein the plurality of nanostructures comprises $Cu_2Se$ or $Cu_{2-x}Se$.

13. The method of claim 9, wherein the plurality of nanostructure comprises nanoparticles.

14. The method of claim 9, wherein the first ligands comprise oleylamine ligands.

15. The method of claim 9, wherein the second ligands comprise hydrazine ligands.

16. The method of claim 9, wherein the first ligands have a longer chain length than the second ligands.

17. The method of claim 1, wherein a largest dimension of a nanostructure of the plurality of nanostructures is about 5 nanometers to 50 nanometers.

18. The method of claim 1, wherein the layer is about 10 nanometers to 10 microns thick.

19. The method of claim 9, wherein a largest dimension of a nanostructure of the plurality of nanostructures is about 5 nanometers to 50 nanometers.

20. The method of claim 9, wherein the layer is about 10 microns to 10 millimeters thick.

* * * * *